United States Patent [19]
Kang et al.

[11] Patent Number: 6,059,952
[45] Date of Patent: May 9, 2000

[54] METHOD OF FABRICATING COATED POWDER MATERIALS AND THEIR USE FOR HIGH CONDUCTIVITY PASTE APPLICATIONS

[75] Inventors: Sung Kwon Kang, Chappaqua; Sampath Purushothaman, Yorktown Heights; Rajinder Singh Rai, Johnson City, all of N.Y.

[73] Assignee: International Business Machines Corporation, Armonk, N.Y.

[21] Appl. No.: 09/111,155

[22] Filed: Jul. 7, 1998

Related U.S. Application Data

[60] Provisional application No. 60/052,172, Jul. 10, 1997.

[51] Int. Cl.$^7$ .............................. C25D 5/00; C25D 7/00; C25D 5/34; C25D 5/50; C23C 28/02
[52] U.S. Cl. ...................... 205/143; 205/144; 205/145; 205/149; 205/187; 205/210; 205/224; 205/225; 205/226
[58] Field of Search ..................... 205/143, 144, 205/145, 149, 187, 210, 224, 225, 226

[56] References Cited

U.S. PATENT DOCUMENTS

| | | | |
|---|---|---|---|
| 5,062,896 | 11/1991 | Huang et al. | 106/287.19 |
| 5,136,365 | 8/1992 | Pennisi et al. | 357/72 |
| 5,213,715 | 5/1993 | Patterson et al. | 252/518 |

*Primary Examiner*—Edna Wong
*Attorney, Agent, or Firm*—Ohlandt, Greeley, Ruggiero & Perle

[57] ABSTRACT

Methods for forming pastes of powder particles coated with an electrically conductive coating are described. The powder particles, with or without an optional first conductive coating layer applied to their surface, are placed in contact with a cathode surface and immersed in an electroplating solution. An anode covered with a nonconducting but ion-permeable membrane is immersed in the solution in close proximity to the cathode. Agitation to move and gently tumble the powder over the cathode surface is provided. The powder particles are plated with a metal or metal alloy coating by biasing the anode with a positive voltage relative to the cathode. The coated powder is removed, rinsed and dried. The powder is added to a polymer material to form a paste which is heated to fuse the powder coating surfaces to form a network of interconnected particles and is further heated to cure the polymer. When the paste is disposed between adjacent electrically conductive surfaces, the coated particles fuse to the electrically conductive surfaces to form electrical interconnections.

41 Claims, 11 Drawing Sheets

METHOD OF FABRICATING COATED POWDER MATERIALS AND THEIR USE FOR HIGH CONDUCTIVITY PASTE APPLICATIONS

This patent application claims priority from Provisional Application Ser. No. 60/052,172, filed Jul. 10, 1997, entitled A METHOD OF FABRICATING COATED POWDER MATERIALS AND THEIR USE FOR HIGH CONDUCTIVITY PASTE APPLICATIONS, to Kang et al.

FIELD OF THE INVENTION

The present invention relates to a method of producing metal powders useful in pastes for forming electroconductive connections between electroconductive members, and methods of use of the same in electronic applications.

BACKGROUND OF THE INVENTION

Most electrical conductors used in electronic devices are made of metals, such as copper, aluminum, gold, silver, lead/tin (solder), molybdenum and others. Solder connection technology using lead/tin alloys plays a key role in various levels of electronic packaging, such as flip-chip connections (i.e., C4), solder-ball connection in ball-grid-arrays (BGA), and IC package connection to a printed circuit board (PCB). Solder joints produced in the electronic packages serve both as electrical interconnections and mechanical/physical connections. When either of those functions is not achieved, the solder joint is considered to have failed.

When microelectronic packages are assembled to a printed circuit board, a lead-tin eutectic solder, 63% Sn-37% Pb, having the lowest melting point (183° C.) among Pb—Sn alloys, is most widely used. In such applications, there are two solder connection technologies employed for mass production: plated-through-hole (PTH) and surface mount technology (SMT) soldering. The basic difference between the two technologies originates from the difference in the PCB design and its interconnection scheme.

In SMT soldering, microelectronic packages are directly attached to the surface of a PCB. A major advantage of SMT is high packaging density, which is realized by eliminating most PTHs in the PCB as well as by utilizing both surfaces of the PCB to accommodate components. In addition, SMT packages have a finer lead pitch and a smaller package size compared to traditional PTH packages. Hence, SMT has contributed significantly to reducing the size of electronic packages.

In SMT soldering, solder paste is applied to a PCB by screen printing. Solder paste consists of fine solder powder, flux, and organic vehicles. During a reflow process, solder particles are melted, flux is activated, solvent materials are evaporated and simultaneously, molten solder coalesces and is eventually solidified. In contrast, in the wave soldering process, a PCB is first fluxed and components are mounted thereon. Then the PCB is moved over a wave of molten solder.

The soldering process is usually completed by subjecting the solder joints to a cleaning step to remove residual flux materials. Due to environmental concerns, CFCs (chlorofluorocarbons) and other harmful cleaning agents used for this purpose are being eliminated. Water-soluble or no-clean flux materials are being used to minimize or eliminate the cleaning steps.

Recent advances in microelectronic devices demand a very fine pitch connection between electronic packages and a printed circuit board (on an order of a few hundred micrometer pitch). The current solder paste technology used in SMT cannot handle this very fine pitch interconnection due to occurrence of soldering defects, such as bridging or solder balling. Another technical limitation of using Pb—Sn eutectic solder is its high reflow temperature, approximately 215° C. That temperature is higher than the glass transition temperature of the epoxy resin used in most polymeric printed circuit board materials. Thermal exposure at this reflow temperature produces significant thermal strains in a printed circuit board, especially in a direction perpendicular to the surface of a PCB, because no structural reinforcement is provided in that direction. Such residual thermal strains in an assembled PCB can significantly degrade reliability.

A more serious concern regarding the usage of lead (Pb)-containing solders is an environmental issue, a trend already experienced in other industries which has led to the elimination of lead from gasoline and paints.

In the electronics industry, two different groups of materials are currently under investigation as possible substitutes for Pb-containing solder materials: Pb-free solder alloys, and electrically conductive pastes (ECP). An electrically conductive paste (or adhesive) includes metallic filler particles loaded in a matrix of a polymer material. The polymer matrix can be any polymer suitable for use in a paste, for example, a thermoplastic or a thermoset. The polymer is selected preferably from the group comprising: epoxies, polyesters and polyimides.

A soluble epoxy, in particular, soluble ketal and a acetal diepoxides, as described in U.S. patent application Ser. No. 08/210,879, filed Mar. 18, 1994, the teaching of which is incorporated herein by reference, can also be used as the polymer matrix. Referring to FIG. 1, an electrically conductive paste 2 with silver-particles 4 and a fill epoxy 6, is a most common example of an electrically conductive paste (schematically shown disposed between surface 8 and surface 10). Silver particles 4 usually are in the shape of flakes and provide electrical conduction by a percolation mechanism, while epoxy fill 6 provides adhesive bonds between the components. Electrically conductive paste 2 has been long used in as a die-bonding material, where its good thermal conduction rather than electrical conduction property is utilized. However, this material has not been accepted for applications requiring high electroconduction and fine pitch connections.

A silver-filled epoxy material has several limitations, such as low electrical conductivity, increase in contact resistance during thermal exposure, low joint strength, silver migration, difficulty in rework, and others. Since a silver-filled epoxy material is electrically conductive in all directions, it is classified as "isotropic" in electroconduction.

There is another class of electrically conductive adhesives (or films), which provide electroconduction only in one direction. This class of the materials is known as "anisotropically" conductive and an example is shown as adhesive film 12 in FIG. 2A. Adhesive film 12 contains electrically conductive particles 18 in a binder or adhesive material 20. Anisotropic conductive adhesive or film 12 becomes conductive only when it is compressed between two conducting surfaces 19 and 21 as shown in FIG. 2B. This process normally requires heat and pressure.

The major application of anisotropic conductive films is for joining of liquid crystal display panels to their electronic printed circuit boards. Conducting particles 18 are usually deformable, such as solder balls, or plastic balls coated with nickel and gold. The binder or adhesive material 20 is mostly a thermosetting resin.

An ECP made of Sn-plated Cu powder and polyimide-siloxane resin is disclosed in our earlier U.S. patent application Ser. No. 08/641,406 filed May 1, 1996 and Ser. No. 08/883,188 filed Jun. 26, 1997. Such an ECP is a good candidate for high temperature solder joints such as controlled collapse chip connections (C4) and solder ball connection (SBC) to a ceramic substrate. However, for polymeric printed circuit board applications, that ECP is not adequate, because the reflow temperature (e.g., 250° C.) is much higher than the glass transition temperature of the polymeric resin used therewith, e.g., FR-4. Candidates for such applications are ECP's made of Cu powder plated with Indium, tin-bismuth alloys or Indium-tin alloys, formulated with polyimide-siloxane resin. The reflow temperature of these powder pastes is expected to be between 120 and 180° C., which is even lower than the reflow temperature of the Pb/Sn eutectic solder, 215° C.

In an earlier U.S. patent application Ser. No. 08/414,063, filed Mar. 31, 1995, we disclosed a process to produce dendritic copper powder overcoated with Sn or Sn and BiSn coatings by electrolytic plating on a rigid inert cathode. The morphology of the powder that can be made by this technique is restricted to the dendritic shape which is not always the preferred one for all ECP applications.

A solder/polymer composite paste material is disclosed in U.S. Pat. No. 5,062,896 (Huang et. al.) and comprises a major proportion of a meltable solder powder filler, such as Bi—Sn, Pb—Sn, Bi—Sn—Pb alloys, a minor proportion of a thermoplastic polymer such as a polyimide siloxane and a minor proportion of a fluxing agent. An oxide-free, partially coalesced solder alloy connection is obtained, which is polymer strengthened and reworkable at a low reflow temperatures, per se, or in the presence of a polymer solvent.

In U.S. Pat. No. 5,286,417 (Mahmoud et. al.), a fusible conductive adhesive is disclosed, which comprises metal alloy fillers such as Sn—Au and Bi—Au, and a thermoplastic polymer having a glass transition temperature overlapping the melting temperature of the metal filler alloys. The loading of the conductive material in the polymer is in the range of about 15% to about 20% by weight.

In U.S. Pat. No. 5,136,365 (Pennisi et. al.), an adhesive material is disclosed, which contains a fluxing agent and metal particles for use in reflow soldering, such as Sn, Pb, In, Bi, Sb, Ag and others, in the matrix of an epoxy resin. Upon reflow soldering, the adhesive forms an isotropic electroconduction between an electrical component and a substrate.

In U.S. Pat. No. 5,213,715 (Patterson et. al.), a directionally conductive polymer is disclosed, which contains a metallic filler powder of Ni or Cu. The metallic powder is treated by a different polymer than the polymer used as a matrix resin. Upon compression, the coated polymer dissolves to make an electrical conductor among the filler particles.

It is an object of the present invention to coat free standing metallic powder of any desired shape, morphology and size with a surface coating of a metal or an alloy by electroplating.

It is another object of the present invention to provide a method of fabricating an electrically conductive paste material which is environmentally safe and low cost.

It is still another object of the present invention to provide a method of fabricating an electrically conductive paste material which produces a higher electrical conductivity than does silver-filled epoxies.

It is a further object of the present invention to provide a method of fabricating an electrically conductive paste material which can be processed at a lower temperature than a reflow temperature of Pb—Sn eutectic solder paste.

SUMMARY OF THE INVENTION

An embodiment of the present invention is a method including the steps of: disposing a powder with a conducting surface in a plating solution contained in a plating cell and allowing it to be in contact with the cathode of the cell; disposing and immersing an anode covered with an optional membrane that is permeable to the plating solution but not the powder particles; providing a controlled agitation to the cell such that the powder bed on the cathode is continuously moved to allow different powder particles to be in direct contact therewith; applying an electrical potential across the anode and cathode to set up a current flow through the electrolyte to facilitate electrolytic plating of the desired coating from the solution onto the powder particles.

A further aspect of the present invention is the production of a powder with two or more layers applied by successive combinations of electroless plating and electroplating to achieve a more versatile combination of coating properties.

In a more particular aspect of this invention, the coated powder is separated from the solution, rinsed and dried and used to formulate electrically conducting adhesives by mixing with a polymer resin dissolved in a suitable solvent.

BRIEF DESCRIPTION OF THE DRAWINGS

Further objects, features, and advantages of the present invention will become apparent from a consideration of the following detailed description of the invention when read in conjunction with the drawing FIGs. in which.

DETAILED DESCRIPTION OF THE INVENTION

Figure 1:
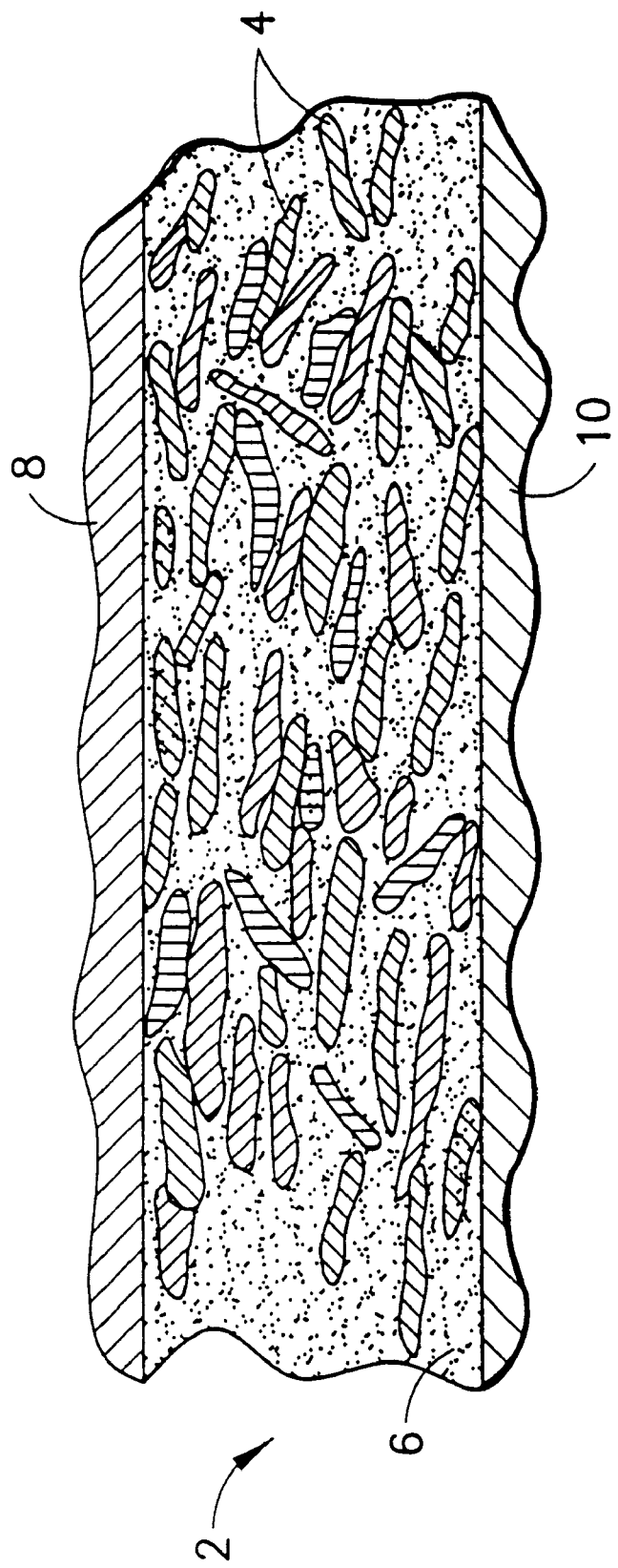
FIG. 1 is a schematic illustration of an electrically conductive paste comprising silver flake particles as a filler in the matrix of epoxy resin. The conductive paste is classified as isotropic in electroconduction.
Figure 2A:
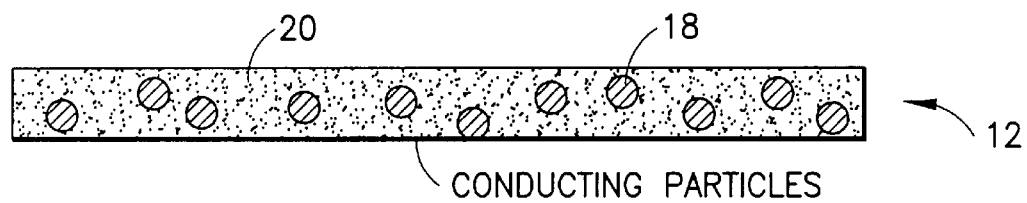
FIGS. 2A and 2B constitute is a schematic illustration of an electrically conductive adhesive which becomes electrically conductive only in one direction when the adhesive film is compressed between two contact or bond pads. The conductive adhesive (or film) is classified as anisotropic.
Figure 2B:
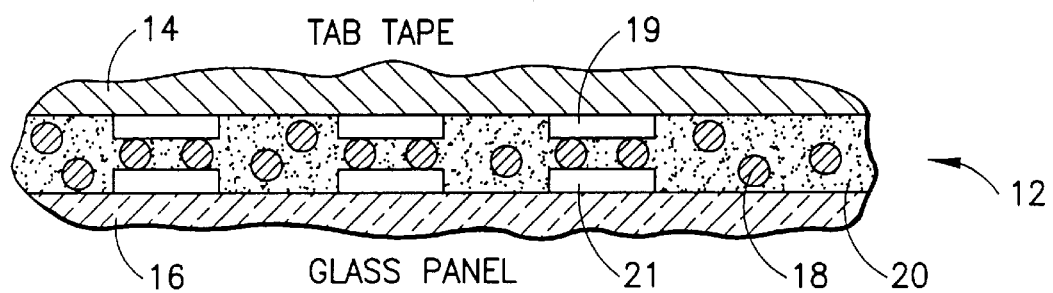
Figure 3:
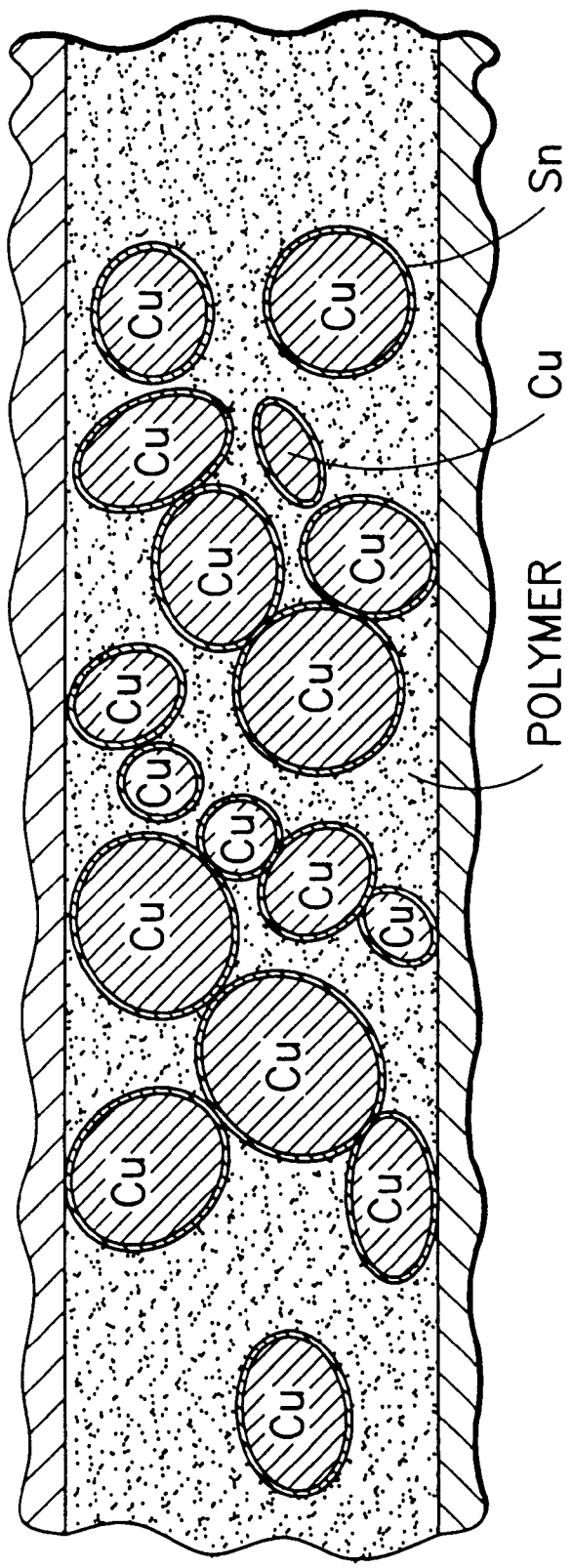
FIG. 3 is a schematic illustration of an electrically conductive paste material, comprising spherical copper powder filled in a matrix of a thermoplastic or thermosetting polymer resin. The copper particles are coated with a low melting point, non-toxic metal such as tin, indium, bismuth, antimony or combinations thereof.

An electrically conductive paste (ECP) material, configured in accord with the invention hereof, comprises copper powder coated with a thin layer of low melting point, Pb-free metals selected from Sn, In, Bi, Sb and their alloys, mixed with an environmentally safe fluxing agent, and dispersed in the matrix of thermoplastic or thermosetting polymers. The microstructure of an ECP containing SnBi coated Cu powder is shown schematically in a cross-section view in FIG. 3.

In one embodiment, an electrically conductive paste material comprises copper powder coated with a tin bismuth alloy, polyimide-siloxane, solvent (acetophenone or n-methyl pyrrolidone) and a carboxylic acid/surfactant. The tin/bismuth coated copper powder is produced by simultaneous electrodeposition of tin and bismuth atoms as an alloy from a commercial electroplating solution (produced by the Lea Ronal Corporation) using the special apparatus illustrated in FIG. 4.

Figure 4:
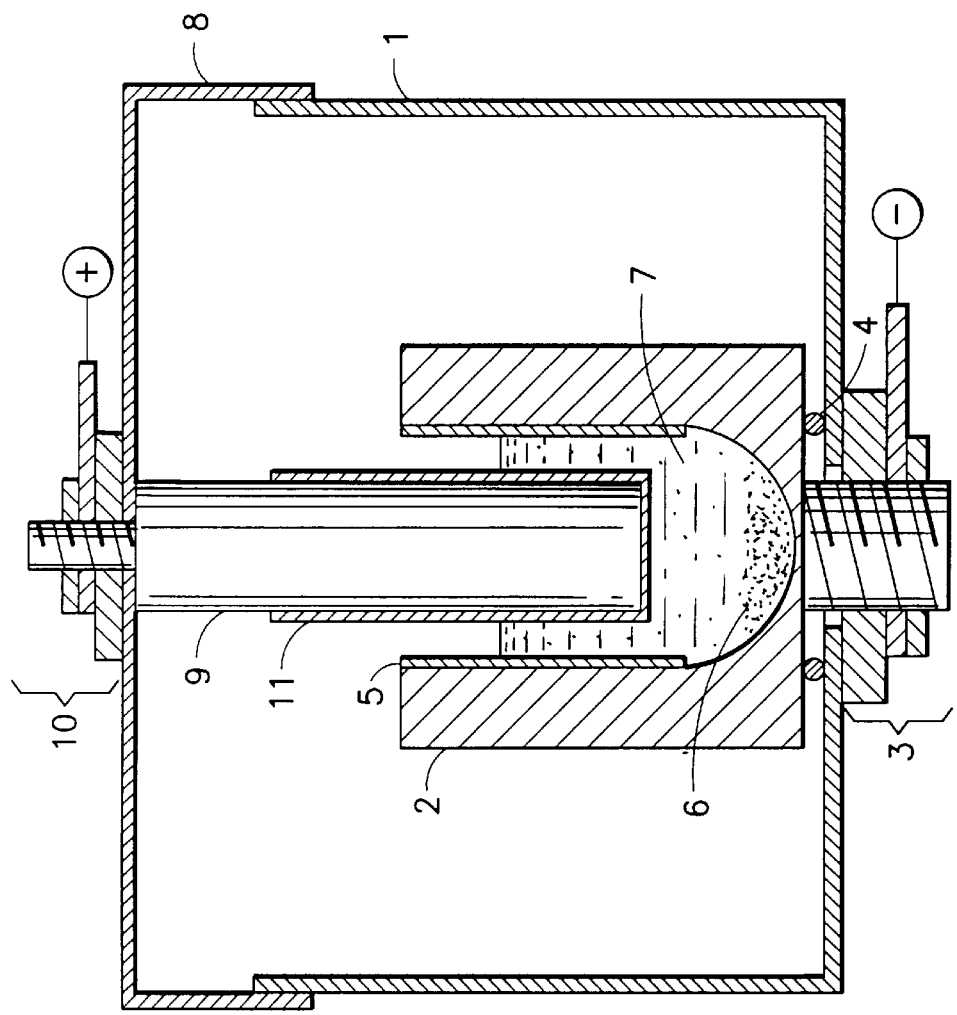
FIG. 4 is a schematic illustration of an apparatus used to electrolytically deposit thin metal or alloy coatings on fine copper powder.

The apparatus consists of an external container 1 made of a nonconducting material, preferably a plastic such as polypropylene or high density polyethylene. A cathode sub-chamber 32 made of aluminum, titanium stainless steel is mounted within this container as shown in FIG. 4 at the bottom. The shape of cathode sub-chamber 32 is essentially cylindrical except that the inside bottom surface has been formed to provide a curved rather than a flat bottom. Cathode 32 is provided with an contact 3 that allows external electrical connection to be made. Appropriate O-ring seals 34 are provided to ensure that extension 3 will not enable leakage of fluids from container 1. Cathode 32 is covered with plater's tape or an insulating lacquer 35 at all inside surfaces, except at the inside bottom and about 5 mm height on the inside sidewall. The uncoated area is the active cathode surface of the cell.

A preweighed amount of conductive powder 36, to be coated is placed in cathode sub chamber 32 and container 1 is filled with a suitable electroplating solution 37 (in this case a SnBi plating solution) so as to partially fill cathode sub-chamber 32. A cap 38 over container 1 is fitted with a suitable anode 39, in the present case a bar of pure tin, (or indium, lead, zinc bismuth, titanium, platinum and alloys thereof) and is provided with a contact 40 to make electrical connection. An optional membrane 41 is wrapped around and secured on anode 39.

Membrane 41 is a liquid and ion permeable polymer membrane (e.g., DARAMIC made by W.R. Grace and Company) and commonly employed as separator in lithium ion batteries with liquid or gel electrolytes. Membrane 41 serves to allow ion and liquid transport and exchange between anode 39 and cathode 32 through its micron sized porosity (e.g., pore sizes of 1 micrometer or less), while preventing any physical contact between the particles and anode 39. Thus, membrane 41 eliminates the possibility of electrolytic dissolution of the powder or any coatings thereon due to contact with anode 39 (which is held at a positive electrical potential). The length and diameter of anode 39 is such that it fits within the cathode sub-chamber 32 and its bottom surface is about 6 mm from the bottom inner surface of cathode sub-chamber 32. Lid 38 is secured tightly such that any agitation of the assembly does not lead to leaking of the electroplating solution from the container.

Anode and cathode contacts 40 and 33 are connected to the positive and the negative poles, respectively, of a dc power supply (e.g., Kepco Model JQE0, 0 to 6V/0 to 20 Amps). The closed container 1 is mounted on a shaker stand (e.g., Mistral Multimixer made by Lab Line Instruments, Illinois) which allows controlled lateral shaking of the contents. This motion is used to facilitate agitation of the bed of powder 36 on the bottom inner surface of cathode sub-chamber 32 so that different powder particles will be brought in direct contact with the surface thereof. A dc voltage is applied to the cell to enable flow of a plating current through the cell.

As the particles tumble on and off the cathode surface they are plated when they are in contact therewith. Different particles are plated randomly at different instances of time during this agitation, leading to coverage of the particles. The plating conditions (namely the voltage, current), the agitation level, and the plating time are variables that are experimentally varied to identify optimum conditions that yield the best results in terms of coverage of the powder and the composition of the coating. This latter property depends on the local current density in the vicinity of the surface being plated.

Figure 5:
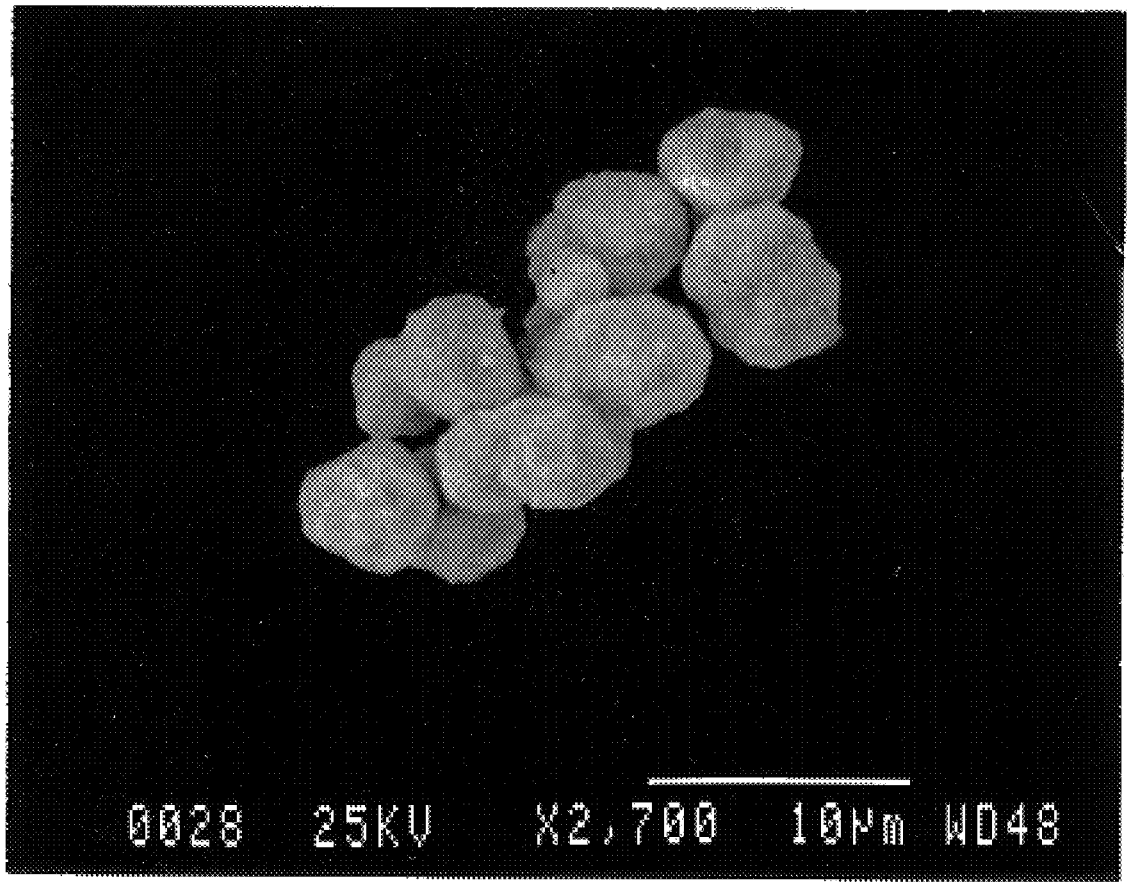
FIG. 5 is a scanning electron micrograph of the structure of SnBi alloy coated copper powder made using the apparatus in FIG. 4 and using the process described below.

FIG. 5 is an SEM photograph of copper powder electroplated with SnBi alloy using the apparatus of FIG. 4.

The copper powder may be replaced by other metal powders, such as nickel, cobalt, silver, palladium or platinum, gold, aluminum and alloys thereof depending on the specific application. Alternatively, a powder can be used that is nonconducting in the bulk but is provided with an electrically conductive surface layer. Metallized ceramic or polymer powders are a typical examples of this class of materials. The tin/bismuth alloy coating can be replaced by other metals such as Sn, In, Zn, Pb, Bi and Sb or their alloys.

Because the process can start with any powder size or aspect ratio, a wide variety of coated filler powders can be used. When such a powder is formulated into an ECP, a joining operation can be performed near the melting point of Sn/Bi alloy which is about 140° C., resulting in sound metallurgical bonding between the particles themselves and between the particles and any contacting substrate contact pad surfaces on electronic devices (typically made of copper, copper/gold, nickel, nickel/gold, nickel/palladium, palladium, or palladium/gold).

Alternately, a coating of indium (melting point 159° C.) or an alloy of indium and tin (melting point 120° C.) can be used as coatings on the copper particles to obtain bonding as described above. Since indium alloys have acceptable wettability on even hard to solder metals such as aluminum, titanium, molybdenum or tungsten, the described material can be used as fillers in ECPs for the joining of liquid crystal display devices. The joining process can be either solid-state or liquid-solid reaction. The polymer curing process can be combined with the joining process depending on the paste formulation so that both these can be achieved in a single bonding cycle.

Because of the metallurgical bonding and the high conductivity copper core, a high electrical conductivity is achieved with the joints made of the new paste material. The metallurgical bonds also provide stable electrical conductivity of the new joints upon thermal exposure and cycling. Also higher joint strengths should be achieved from the combined effect of the metallurgical and adhesive bonds. It should be noted that such bonding is achieved at significantly lower temperatures than what is currently practiced for PbSn eutectic solder assemblies (215° C.), thereby reducing the thermal stresses and the associated warpage that may occur in card substrates.

Figure 6:
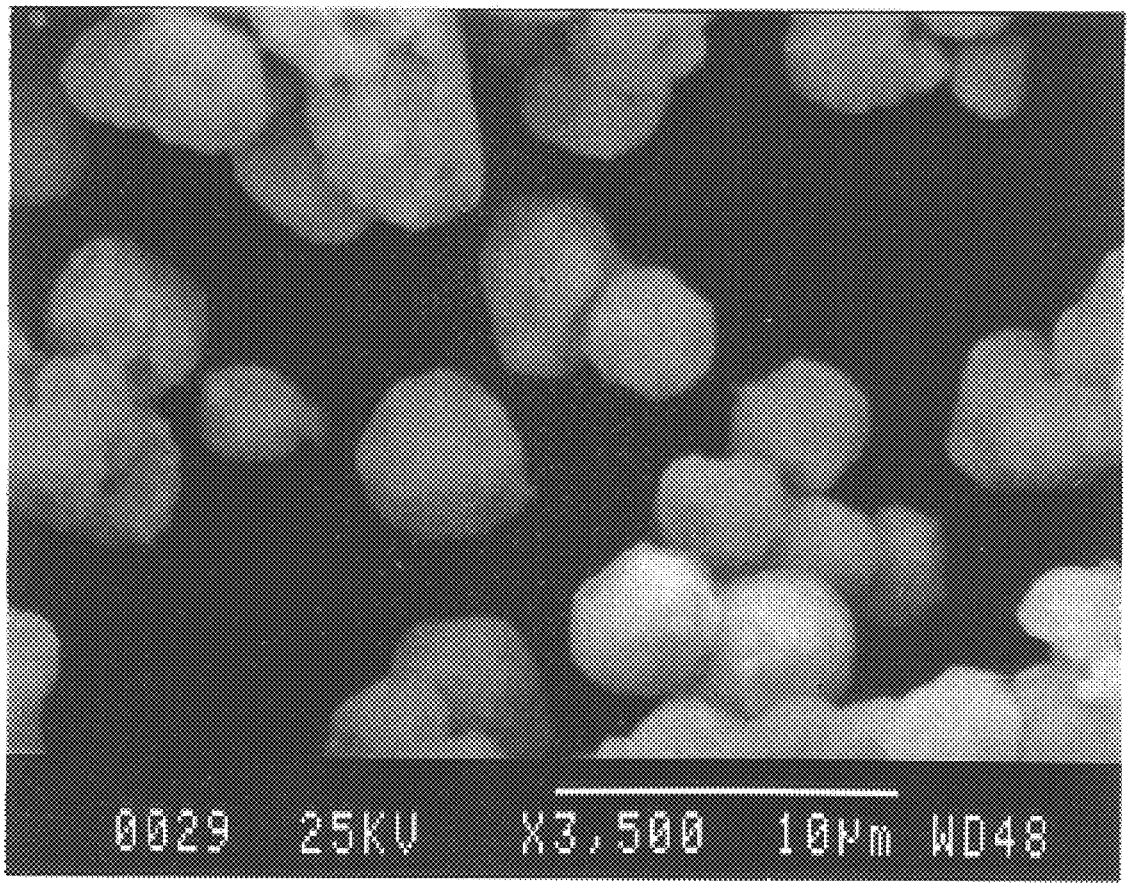
FIG. 6 is a scanning electron micrograph of copper powder coated first with electroless Sn followed by a SnBi alloy coating, showing its shape and morphology.

In another variant of the invention, a low melting temperature and uniform coverage can be achieved in the following manner. A coating of a thin layer of Sn can be applied by electroless plating first on the copper powder as described in our earlier patent application Ser. No. 08/641,406, filed May 1, 1996, and Ser. No. 08/883,188, filed Jun. 26, 1997, the disclosures of which are incorporated herein by reference. This is followed by electroplating the SnBi alloy as described above. The combination ensures complete coverage of all copper surfaces and provide a low melting coating alloy. FIG. 6 is an SEM photograph of copper powder first plated with Sn by an electroless process and then electroplated with SnBi by the process described herein.

In a more general variant, the coating can be any metal or alloy that can be coated on the powder by electroless or electrolytic plating, with additional coating of metal or alloy applied by electrolytic or electroless plating, so that the combination provides the desired lower melting point alloy.

The polymer component of the paste can be polymer resins prepared from renewable resources or bio-based materials after appropriate functionalization to achieve the desirable thermal and rheological properties. Lignin (by product from paper manufacture), cellulose, wood or crop oils are candidates for this purpose. Use of these materials is environmentally preferable because they are derived from natural and renewable resources and can be disposed of more readily at the end of the useful life of the electronic assembly. This is particularly attractive because the use of the coated copper powder as a filler eliminates the use of lead (Pb) containing solders. The resulting paste formulation is thus Pb-free, non-toxic and hence easily disposable. Other polymer resins may be used, such as polyimides, polyimide-siloxanes, siloxanes, epoxies, phenoxy polymers, and soluble epoxy with a ketal and acetal diepoxides.

Our previous application Ser. No. 08/326,626, filed on Oct. 24, 1994, the disclosure of which is incorporated herein by reference, teaches the use of tin-coated copper powder as a filler material in formulating an electrically conductive paste. The copper powder has a spherical morphology, which can be produced by either powder atomization or an electrodeposition process. Tin coating is performed on copper powder by using an electroless immersion Sn plating solution.

Since there is no commercial immersion plating process available for many of the coating metals of interest, specifically indium, bismuth and antimony, coating of copper powder by a process similar to the tin-coating on copper powder described above is not possible. The process and structure of the present invention provide a solution to this problem through an electroplating method to coat copper, silver, gold, palladium, nickel and alloys thereof; or In, Bi,Sb, Sn and Pb or alloys thereof on free standing powder particles. The method is also applicable to other metal coatings that cannot be obtained easily by electroless plating.

EXAMPLE 1

About 1 gm of spheroidal copper powder, nominally 5 to 7 micron diameter, supplied by Degussa Corporation, South Plainfield, N.J., was cleaned in a 5% sulfuric acid/water solution to remove the native surface oxide, rinsed in deionized water and then isopropanol and dried. The cathode barrel of the plating setup was assembled on the containment vessel and then filled with 30 ml of the SnBi alloy plating solution purchased from LeaRonal Corporation. The cleaned copper powder was transferred and stirred into a suspension in the solution. The top cap of the containment vessel was screwed on, resulting in the Sn anode being immersed in the plating solution contained in the cathode barrel.

The assembly was then placed on the shaker apparatus (Mistral Multimixer made by Labline Instruments, Illinois) and secured to the vibrating top platform. The anode of the plating cell was connected to the positive terminal and the cathode was connected to the negative terminal of a Kepco JQE 0 to 6V/0 to 20 Amps dc power supply. The shaker was set to oscillation level 5. The dc power supply was turned on and a plating current of 2 amps was established at a supply voltage of about 2 to 4 volts.

Plating was carried out for 10 minutes. The power supply was turned off, the leads disconnected, and the plating cell disassembled. The used plating solution was pipetted out, the powder rinsed thoroughly in deionized water and isopropanol to eliminate any residual plating chemicals. The powder was then scooped out of the barrel, dried and pulverized with a pestle and mortar, if necessary.

Figure 7:
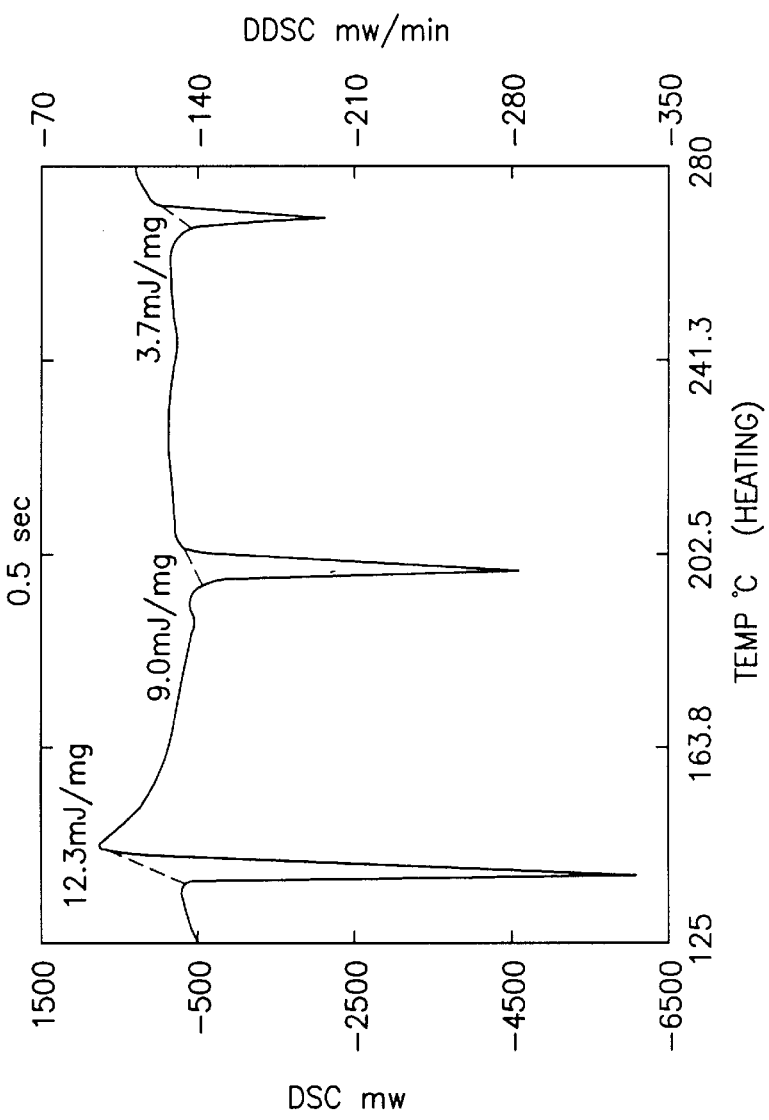
FIG. 7 is a differential scanning calorimeter (DSC) scan of SnBi plated copper powder showing the three distinct melting processes that occur in the coating layer.

FIG. 6 is a scanning electron microscope (SEM) photograph of the plated powder particles. A small sample of the powder (usually 10 mg) was loaded into a Model SSC/5200 differential scanning calorimeter (DSC) made by Seiko Inc. The sample was heated at a rate of 5 degrees C per minute from room temperature to 300° C. to monitor the melting processes that occur in the material. FIG. 7 shows a typical DSC scan indicating that distinct melting processes occur at 140° C., 200° C. and 270° C., corresponding to (i) the melting of a eutectic SnBi alloy, (ii) an off-eutectic bismuth rich SnBi alloy that melts at 200° C. and (iii) the melting of some free bismuth, respectively. It is important to note that the surface coating has an incipient melting point of 140° C.

Figure 8:
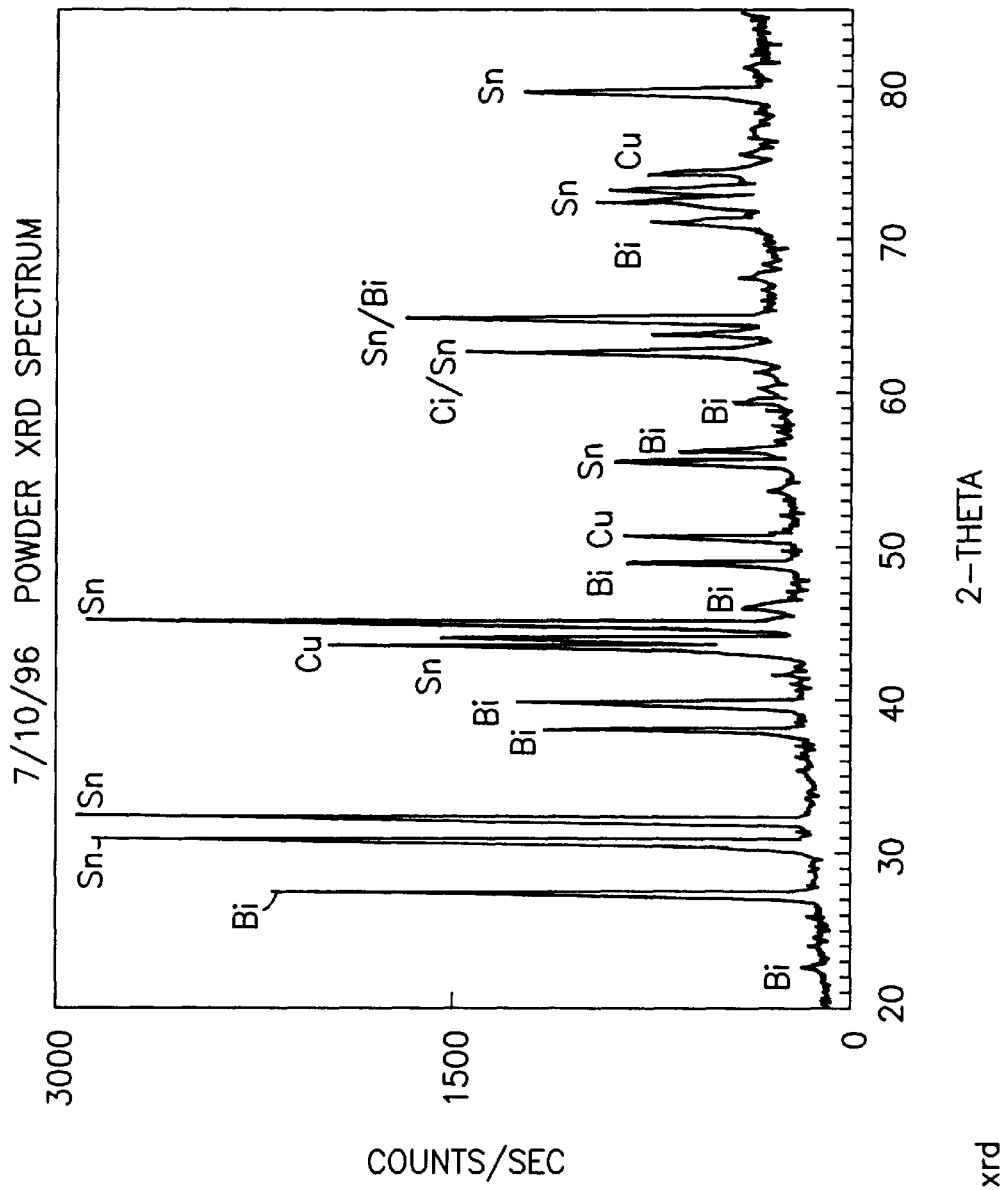
FIG. 8 is an x-ray diffractogram of the SnBi plated copper powder showing the presence of peaks characteristic of crystalline copper, tin and bismuth.

A small amount of the plated powder was sprinkled on a glass slide with a double stick adhesive tape on it, to make a thin bed of powder. The sample was then loaded into a Philips X-ray diffractometer and a θ/2θ x-ray diffraction scan was performed to identify characteristic peaks of crystalline phases in the powder. A typical scan is shown in FIG. 8 and indicates that diffraction peaks corresponding to Cu, Sn and Bi are present and that the copper coverage by the SnBi coating is good.

Thus it was concluded that the above described procedure produces fine copper powder overcoated with a SnBi alloy layer with a lowest melting point of 140° C.

EXAMPLE 2

A small amount of spheroidal copper powder nominally 5 to 7 micron diameter (supplied by Degussa Corporation, South Plainfield, N.J.), was cleaned in a 5% sulfuric acid/water solution to remove the native surface oxide, rinsed in deionized water and then isopropanol. Clean copper powder was transferred into an immersion tin plating solution, TINPOSIT LT-34 (from Shipley, Marlboro, Mass.) to produce a thickness of 0.3 to 0.5 μm on 5–7 μm copper powder. The cathode barrel of the plating setup was assembled onto the containment vessel and then filled with 30 ml of the SnBi plating solution, SOLDERON BI (from LeaRonal Corporation, Freeport, N.Y.).

The Sn coated copper powder was transferred and stirred into a suspension in the solution. The top cap of the containment vessel was put in place, resulting in the Sn anode being immersed in the plating solution contained in the cathode barrel. The assembly was then placed on the shaker apparatus (Mistral Multimixer made by Labline Instruments, Illinois) and secured to the vibrating platform. The anode of the plating cell was connected to the positive terminal and the cathode was connected to the negative terminal of a Kepco JQE 0 to 6V/0 to 20 amps dc power supply. The shaker was set to oscillation level 5. The dc power supply was turned on and a plating current of 2 amps was established at a supply voltage of about 2 to 4 volts.

Plating was carried out for 10 minutes. The power supply was turned off, the leads disconnected, and the plating cell disassembled. The used plating solution was pipetted out, the powder rinsed thoroughly in deionized water and isopropanol to eliminate any residual plating chemicals. The powder was then scooped out of the barrel, dried and pulverized with a pestle and mortar.

Figure 9:
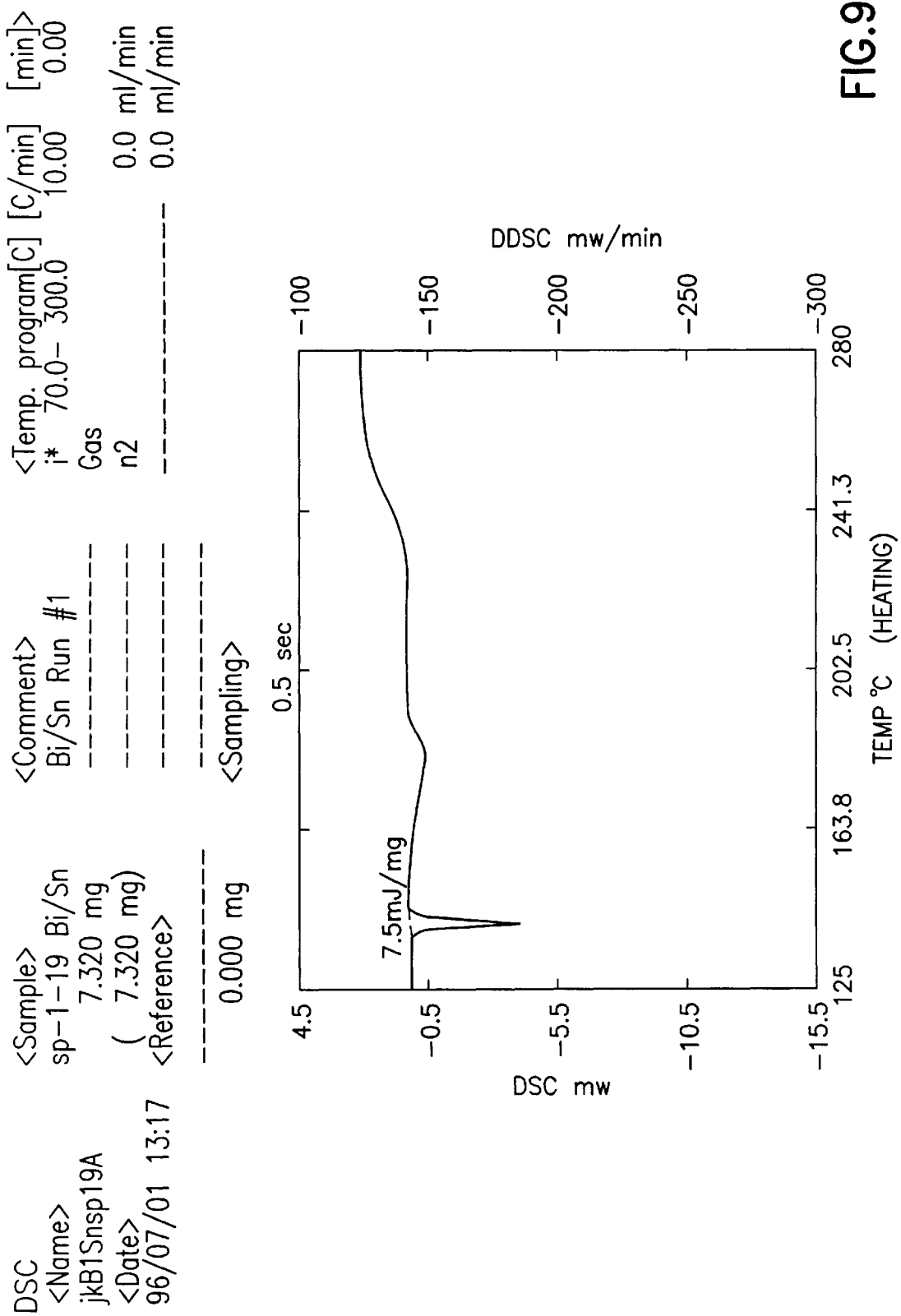
FIG. 9 is a DSC scan of the Sn and then SnBi coated copper powder showing a single distinct melting point of the coating layer at 140 C. Note the broad melting at temperatures above 140 C.
Figure 10:
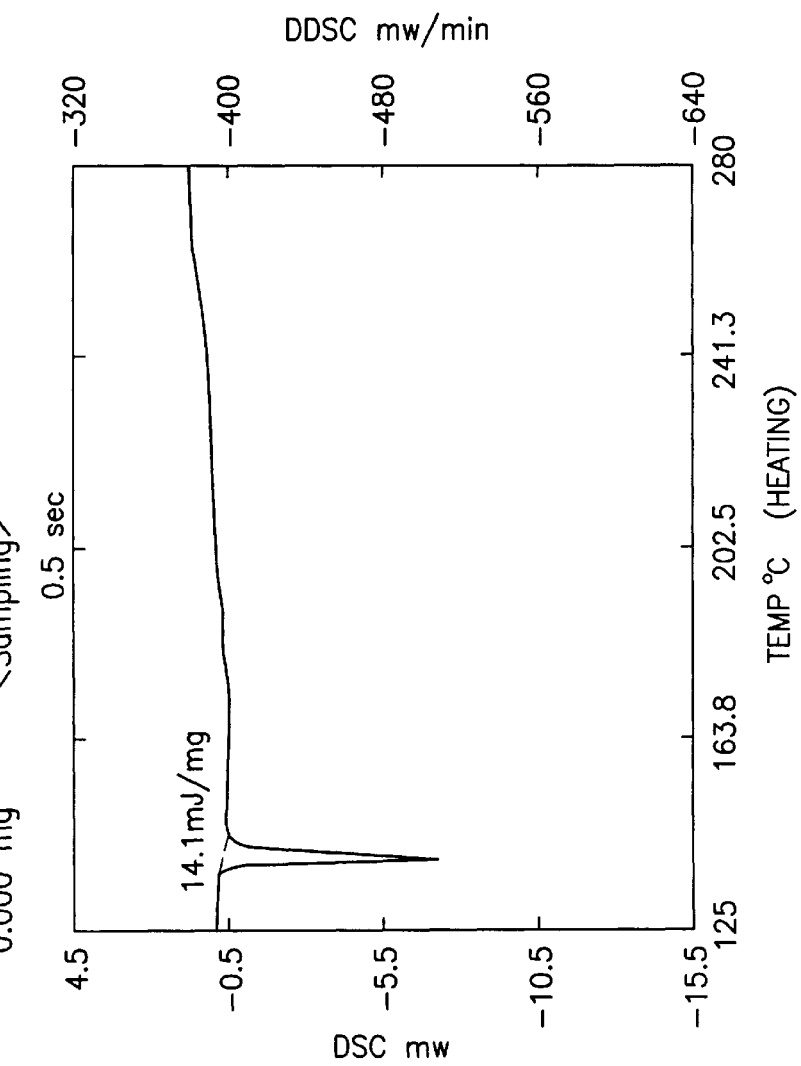
FIG. 10 is a re-scan of the sample scanned once as in FIG. 9. Note that the scan shows a larger peak at 140° C. and the absence of the broad melting at higher temperatures.

A small sample of the powder (usually 10 mg) was loaded into a Mode 1SSC/5200 differential scanning calorimeter (DSC) made by Seiko Inc. The sample was heated at a rate of 5 degrees C per minute from room temperature to 300° C. to monitor the melting processes that occur in the material. FIG. 9 shows a typical DSC scan indicating a single distinct melting process at 140° C., corresponding to the melting of a eutectic SnBi alloy, with a broad melting behavior seen at higher temperatures without any distinct peaks. It is important to note that this is in contrast to the multiple melting point behavior seen in Example 1. This is believed to be a result of the combination of the excess Bi and the Bi rich alloy in the electroplated SnBi coating with the electroless plated Sn undercoat to form a near-eutectic mixture. A second DSC scan (see FIG. 10) of the powder, already scanned once to 300° C., confirms this since it only exhibits a single and larger melting peak at 140° C.

Figure 11:
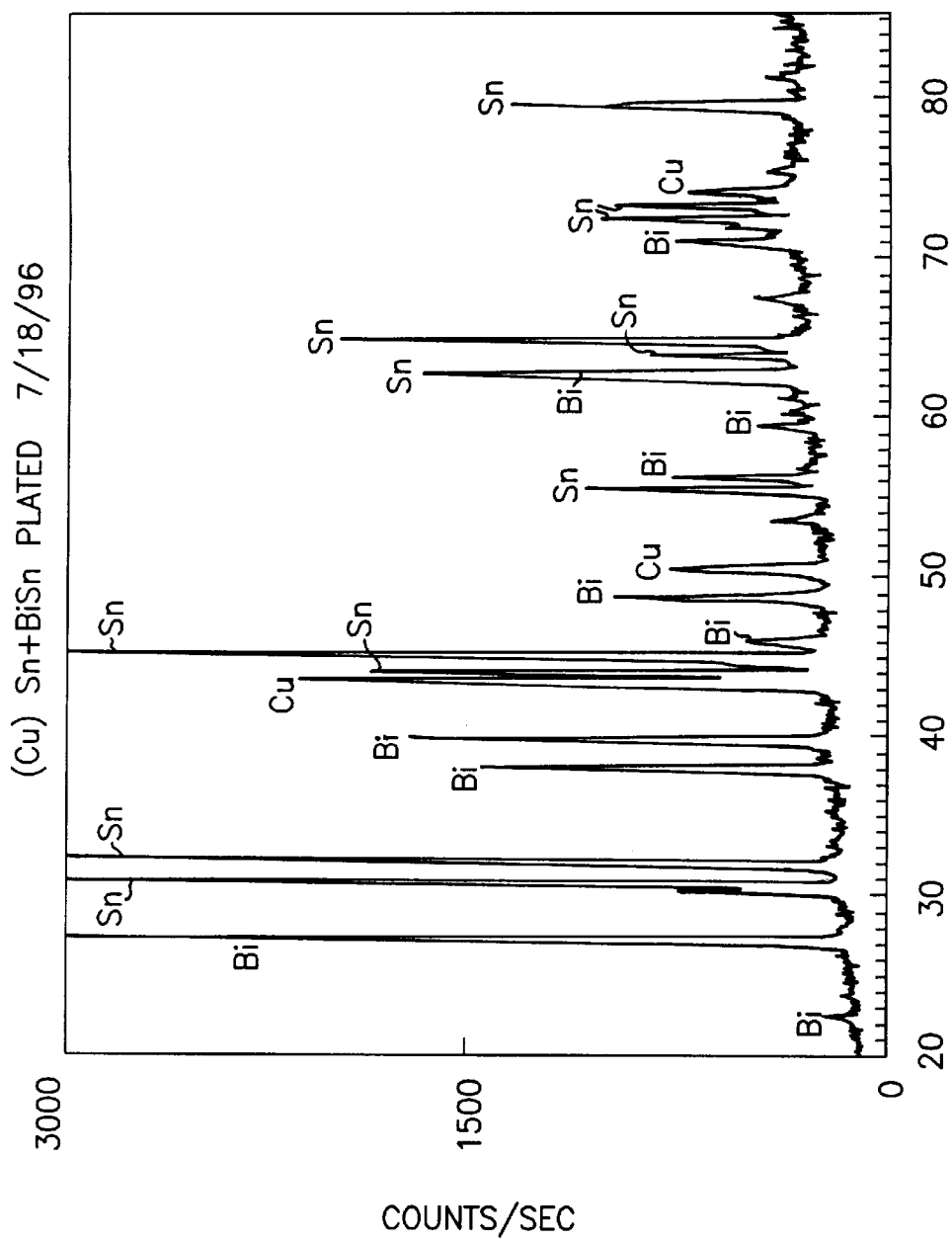
FIG. 11 is an X-ray diffraction of Sn and SnBi plated copper powder powder showing the presence of peak characteristics of crystalline Cu, Sn and Bi.

A small amount of the plated powder was sprinkled on a glass slide with a double stick adhesive tape on it, to make a thin bed of powder. The sample was then loaded into a Philips X-ray diffractometer and a θ/2θ x-ray diffraction scan was performed to identify characteristic peaks of the crystalline phases in the powder. A typical scan, shown in FIG. 11, indicates that diffraction peaks corresponding to Cu, Sn and Bi are present and the copper coverage by the SnBi coating is good. Comparison with FIG. 8 shows that the copper coverage by the coating is more complete as would be expected from the process used in Example 2.

Thus it was concluded that the above described procedure produces a fine copper powder overcoated with a eutectic SnBi alloy layer with a single melting point of 140° C.

EXAMPLE 3

BiSn-plated copper powder was used to formulate a conducting paste by mixing with polyimide siloxane resin dissolved in a solvent of n-methyl pyrrolidone (NMP), acetophenone pyrrolidone, methyl benzoate, propylene glycol, methyl ether acetate, or ethyl benzoate, butyric acid and a no-clean flux, (FLUX305 from Qualitek International, Inc., Addision, Ill.). The relative amount of the filler powder over the polymer resin varied from 30 to 90% in weight, depending on a specific application. To insure uniform dispersion of the ingredients, the mixture was processed in a three-roll shear mill.

When the filler weight percent is low, a solvent drying process, for example, 100° C., 1 hour, is required to adjust the viscosity of the paste before dispensing the paste onto a desired footprint.

In order to characterize the electrical and mechanical properties, model joint samples made of the BiSn-plated filler conductive paste were manufactured by laminating two "L-shaped" copper coupons. The lamination was performed at a temperature slightly above the melting point of BiSn coating, for example, 180° C., at a pressure of 25 psi.

Contact resistance of the model joints was measured by the four point probe method. The contact resistance values from a nominal joint area of 1.25 mm in diameter ranged from 1.4 to $4.0 \times 10^{-4}$ Ω. These values were equivalent to those of the model joints made with a commercial Ag-filled conductive paste.

The shear strength of the model joints made of the BiSn-plated powder was in the range of 5.7 to 8.2 lb, which was comparable to or better than those of the commercial paste.

EXAMPLE 4

The powder obtained in Example 2, Sn- and BiSn-plated copper powder (Cu/Sn/BiSn), was used to formulate a conducting paste by mixing with polyimide siloxane resin dissolved in a solvent of NMP, acetophenone, or ethyl benzoate, and a no-clean flux, (FLUX305, from Qualitek International, Inc., Addision, Ill.). The relative amount of the filler powder over the polymer resin varied from 30 to 90% in weight, depending on a specific application.

In order to characterize the electrical and mechanical properties, model joint samples made of the BiSn-plated filler conductive paste were manufactured by laminating two "L-shaped" copper coupons. The lamination was performed at a temperature slightly above the melting point of BiSn coating, for example, 180° C., at a pressure of 25 psi.

Both electrical and mechanical properties of the model joint samples were characterized by four-point probe and shear testing. The contact resistance from the nominal joint area of 1.25 mm in diameter ranged from 1.3 to $2.5 \times 10^{-4}$ Ω. These values were equivalent to those of the model joints made with a commercial Ag-filled conductive paste. The shear strengths of the model joints were in the range of 6.5 to 8.9 lb, which was better than those of the commercial paste.

While the present invention has been described with respect to preferred embodiments, numerous modifications, changes, and improvements will occur to those skilled in the art without departing from the spirit and scope of the invention. The method of the invention may be applied to connect chip contact to a substrate contact or a liquid crystal display panel contact and a chip support frame lead. Further, the paste may be heated to a temperature that fuses coatings on adjacent powder particles and particles to the chip contact and substrate contact. The temperature may be sufficient to also cure the polymer resin in the paste. The paste may also be heated to a single temperature to achieve (i) a fusing of the coated powder particles to each other and to the conductive surfaces and (ii) a curing of the polymer, in one step.

What is claimed is:

1. A method comprising the steps of:
   providing a hollow cathode chamber filled with a suitable electroplating solution;
   securing the said hollow cathode chamber within a second containment chamber;

disposing a mass of powder, having a conducting surface, within the hollow cathode chamber, in contact with said electroplating solution;

disposing a conducting anode covered with an ion permeable, electrically nonconducting membrane within the hollow cathode chamber;

agitating and tumbling said mass of powder to enable contact with an inner surface of the hollow cathode chamber; and biasing the said anode with a positive voltage in reference to the said hollow cathode chamber so as to cause the electroplating of a metallic coating on said powder.

2. A method according to claim 1, wherein said powder is electrically conducting.

3. A method according to claim 2, wherein said powder is selected from the group consisting of: copper, silver, gold, nickel, palladium, platinum, aluminum and alloys thereof.

4. A method according to claim 1, wherein particles comprising said powder are nonconducting but possess a surface layer that is electrically conductive.

5. A method according to claim 4, wherein the powder is made of a polymeric material and said surface layer comprises copper, silver, nickel, gold, palladium, platinum, aluminum or alloys thereof.

6. A method according to claim 1, wherein said electroplating solution enables deposition of a thin conductive coating of a low melting point metal or an alloy on particles comprising said powder.

7. A method according to claim 6, wherein said low melting point metal is selected from the group consisting of: indium, tin, bismuth, antimony, lead, zinc and alloys thereof.

8. A method according to claim 1, wherein the hollow cathode chamber is constructed of one of: aluminum, titanium, or stainless steel.

9. A method according to claim 1, wherein said anode is constructed of one of: indium, tin, lead, zinc, bismuth, titanium, platinum or alloys thereof.

10. A method according to claim 1, wherein said ion-permeable membrane is a microporous polymer film with pore sizes of 1 micrometer or less.

11. A method according to claim 1, comprising the further step of:

making an electrically conducting paste by mixing the coated powder with a polymer resin dissolved in a solvent, butyric acid, and no-clean flux.

12. A method according to claim 11, wherein said solvent is selected from the group consisting of: n-methyl pyrrolidone, acetophenone, methyl benzoate, propylene glycol, methyl ether acetate and ethyl benzoate.

13. A method according to claim 11, comprising the further step of:

disposing said paste between a first electrically conductive surface and a second electrically conductive surface.

14. A method according to claim 13, wherein said first electrically conductive surface is a chip contact and said second electrically conductive surface is a substrate contact.

15. A method according to claim 14, wherein said paste is heated to a temperature to fuse said coatings on adjacent powder particles and particles to the chip contact and substrate contact.

16. A method according to claim 15, wherein said paste is heated to a temperature sufficient to cure said polymer resin.

17. A method according to claim 13, wherein said first electrically conducting surface is a liquid crystal display panel contact and said second electrically conductive surface is a chip support frame lead.

18. A method according to claim 13 wherein the paste is heated to a single temperature to achieve (i) a fusing of said coated powder to each other and to the conductive surfaces and (ii) a curing of the said polymer resin, in one step.

19. A method according to claim 11, wherein said polymer resin is selected from the group consisting of: polyimides, polyimide-siloxanes, siloxanes, epoxies, phenoxy polymers, soluble epoxy with a ketal and acetal diepoxides, bio-based resins made from lignin, cellulose, wood oils and crop oils.

20. A method comprising the steps of:

precleaning a powder with a conducting surface in a suitable solution to remove'surface oxides;

immersing and agitating the powder in an electroless immersion plating solution at an appropriate temperature to achieve a deposition of a thin metallic layer on surfaces of particles comprising the powder and create a coated powder;

cleaning and drying the powder;

providing a hollow cathode chamber filled with a suitable electroplating solution;

placing the said hollow cathode chamber within a second containment chamber;

disposing a mass of said coated powder within the hollow cathode chamber in contact with said electroplating solution;

disposing a conducting anode covered with an ion permeable, electrically nonconducting membrane within the hollow cathode chamber;

agitating and tumbling said coated powder to cause a contact thereof with an inner surface of the hollow cathode chamber; and biasing said conducting anode with a positive voltage in reference to said hollow cathode chamber so as to cause an electroplating of a second metallic coating on the surface of said coated powder.

21. A method according to claim 20, wherein said powder is electrically conducting.

22. A method according to claim 21, wherein said powder is selected from the group consisting of: copper, silver, gold, nickel, palladium, platinum, aluminum and alloys thereof.

23. A method according to claim 20, wherein said powder is nonconducting but possesses a surface layer that is electrically conductive.

24. A method according to claim 23, wherein the powder is made of a polymeric material and is provided with a conducting surface layer selected from the group consisting of: copper, silver, nickel, gold, palladium, platinum, aluminum and alloys thereof.

25. A method according to claim 20, wherein the thin metallic layer applied by electroless immersion plating provides substantially full coverage of surfaces of particles comprising said powder.

26. A method according to claim 25, wherein said thin metallic layer is selected from the group consisting of: tin, copper, silver, gold, palladium, nickel and alloys thereof.

27. A method according to claim 20, wherein said electroplating solution produces a thin conductive coating of a low melting point metal or an alloy on said particles.

28. A method according to claim 27 wherein the second metallic coating is selected from the group consisting of: indium, tin, bismuth, antimony, lead, zinc and alloys thereof.

29. A method according to claim 20, wherein said thin metallic layer and said second coating intermix to form a lower melting point alloy.

30. A method according to claim 20, wherein the hollow cathode chamber is comprised of aluminum, titanium, or stainless steel.

31. A method according to claim 20, wherein said anode is comprised of: indium, tin, lead, zinc, bismuth, titanium, platinum or alloys thereof.

32. A method according to claim 20, wherein said ion-permeable membrane is a microporous polymer film with pore sizes of 1 micrometer or less.

33. The method according to claim 20 further comprising the step of:

making an electrically conducting paste by mixing the coated powder with a suitable polymer resin dissolved in a solvent, butyric acid, and no-clean flux.

34. A method according to claim 33, wherein said polymer resin is selected from the group consisting of: polyimides, polyimide-siloxanes, siloxanes, epoxies, phenoxy polymers, soluble epoxy with ketal and acetal diepoxides, bio-based resins made from lignin, cellulose, wood oils and crop oils.

35. A method according to claim 33, wherein said solvent is selected from the group consisting of n-methyl pyrrolidone, acetophenone, methyl benzoate, propylene glycol, methyl ether acetate and ethyl benzoate.

36. A method according to claim 33, comprising the added step of:

disposing said paste between a first electrically conductive surface and a second electrically conductive surface.

37. A method according to claim 36, wherein said first electrically conductive surface is a semiconductor chip contact and said second electrically conductive surface is a substrate contact.

38. A method according to claim 37, wherein said paste is heated to a temperature to fuse said coating on adjacent powder particles and particles to the chip contact and substrate contact.

39. A method according to claim 38, wherein said paste is heated to a temperature sufficient to cure said polymer resin.

40. A method according to claim 33 wherein the paste is heated to a single temperature to achieve (i) a fusing of said coated powder particles to each other and to the contacts and (ii) a curing of the said polymer resin, in one step.

41. A method according to claim 36, wherein said first electrically conducting surface is a liquid crystal display panel contact and said second electrically conductive surface is a frame lead location.

* * * * *